United States Patent
Zhao et al.

(10) Patent No.: US 11,563,439 B2
(45) Date of Patent: Jan. 24, 2023

(54) DAC DUTY CYCLE ERROR CORRECTION

(71) Applicant: Analog Devices International Unlimited Company, Limerick (IE)

(72) Inventors: Jialin Zhao, Beijing (CN); Gil Engel, Lexington, MA (US); Yunzhi Dong, Weehawken, NJ (US)

(73) Assignee: ANALOG DEVICES INTERNATIONAL UNLIMITED COMPANY, Limerick (IE)

( * ) Notice: Subject to any disclaimer, the term of this patent is extended or adjusted under 35 U.S.C. 154(b) by 188 days.

(21) Appl. No.: 17/214,697

(22) Filed: Mar. 26, 2021

(65) Prior Publication Data

US 2022/0255555 A1    Aug. 11, 2022

(30) Foreign Application Priority Data

Feb. 8, 2021 (WO) .................. PCTCN2021076063

(51) Int. Cl.
    *H03M 1/06*      (2006.01)
    *H03K 5/156*     (2006.01)
(52) U.S. Cl.
    CPC ........ *H03M 1/0617* (2013.01); *H03K 5/1565* (2013.01)
(58) Field of Classification Search
    CPC ........................... H03M 1/617; H03K 5/1565
    See application file for complete search history.

(56) References Cited

U.S. PATENT DOCUMENTS

| | | | |
|---|---|---|---|
| 6,967,514 B2 | 11/2005 | Kizer et al. | |
| 7,605,608 B1* | 10/2009 | Rezzi ............. | H03K 19/018521 326/27 |
| 8,106,697 B2 | 1/2012 | Chang et al. | |
| 11,128,310 B1* | 9/2021 | Zhao .................... | H03M 1/1071 |
| 11,265,001 B1* | 3/2022 | Lahiri ................. | H03M 1/0863 |
| 2014/0266824 A1* | 9/2014 | Lowney .............. | H03M 1/1009 341/120 |
| 2022/0109460 A1* | 4/2022 | Liu ........................ | H03M 1/66 |

OTHER PUBLICATIONS

Mohyar et al., *Digital Calibration Algorithm for Current-Steering DAC Linearity Improvement*, ISOCC 2014, Nov. 3-6, 2014, Jeju, Korea, 38 pages.

(Continued)

*Primary Examiner* — Lam T Mai
(74) *Attorney, Agent, or Firm* — Akona IP PC

(57) ABSTRACT

Digital to analog converter generates an analog output corresponding to a digital input by controlling DAC cells using bits of the digital input. The DAC cells individually make a contribution to the analog output. Due to process, voltage, and temperature variations, the DAC cells may have duty cycle error or mismatches. To compensate for the duty cycle error of a DAC cell, a small amount of charge is injected into a low-impedance node of a DAC cell when the data signal driving the DAC cell transitions, or changes state. The small amount of charge is generated using a capacitive T-network, and the polarity of the charge injected is opposite of the error charge caused by duty cycle error. The opposite amount of charge thus compensates or cancels out the duty cycle error, and duty cycle error present at the output of the DAC cell is reduced.

20 Claims, 10 Drawing Sheets

(56) References Cited

OTHER PUBLICATIONS

Mercer, *Current Steering Digital-to-Analog Converters*, Wiki, downloaded Oct. 11, 2020, www.wiki.analog.com/university/courses/tutorials/cmos-dac-chapter, 29 pages.

Razavi, *The Current-Steering DAC*, IEEE Solid-State Circuits Magazine, Winter 2018, 5 pages.

He et al., *A 50MHz-BW Continuous-Time ΔΣ ADC with Dynamic Error Correction Achieving 79.8dB SNDR and 95.2dB SFDR*, ISSCC 2018, Session 14, High-Resolution ADCs, 14.1, 3 pages.

Tang et al., *A 14b 200Ms/s DAC with SFDR>78dBc, IM3<-83dBc and NSD<-163dBm/Hz across the whole Nyquist Band enabled by Dynamic-Mismatch Mapping*, 2010 Symposium on VLSI Circuits/Technical Digest of Technical Papers, 2 pages.

\* cited by examiner

DAC DUTY CYCLE ERROR CORRECTION

CROSS REFERENCE TO RELATED APPLICATIONS

This application claims the benefit of and priority from PCT Application No. PCT/CN2021/076063 filed 8 Feb. 2021, entitled "DAC DUTY CYCLE ERROR CORRECTION", which is incorporated herein by reference in its entirety.

TECHNICAL HELD OF THE DISCLOSURE

The present disclosure relates generally to digital to analog converters (DACs) and, more particularly but not limited to, to DAC.

BACKGROUND

DACs are used in a variety of applications to convert a digital signal into an analog signal. For example, a processor can generate a digital signal, and a DAC can convert the digital signal into an analog signal suitable for transmission over a wired or wireless medium. A DAC can be characterized by, e.g., resolution, speed/sampling rate, bandwidth, dynamic range, amount of harmonic distortion or noise, power consumption, area/size, etc.

Design of a DAC can vary depending on the target specifications. Some DACs are designed for precision, while some DACs are designed for speed. All DACs would include DAC cells, which are controllable by a digital input and contribute to an analog output. For instance, a DAC cell can be controlled to provide a certain amount of charge to the analog output. In aggregate, the DAC cells can be operable to output an analog output that corresponds with the digital input to the DAC.

When the DAC cells do not perform in an ideal manner, errors, or spurs may be manifested in the aggregate output of the DAC. These errors or spurs can degrade the performance of the DAC. Some circuit designers may opt to use more power hungry circuitry to reduce such errors or spurs. However, such solutions would not be suitable if power consumption is a concern.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

DESCRIPTION OF EXAMPLE EMBODIMENTS OF THE DISCLOSURE

Figure 1:
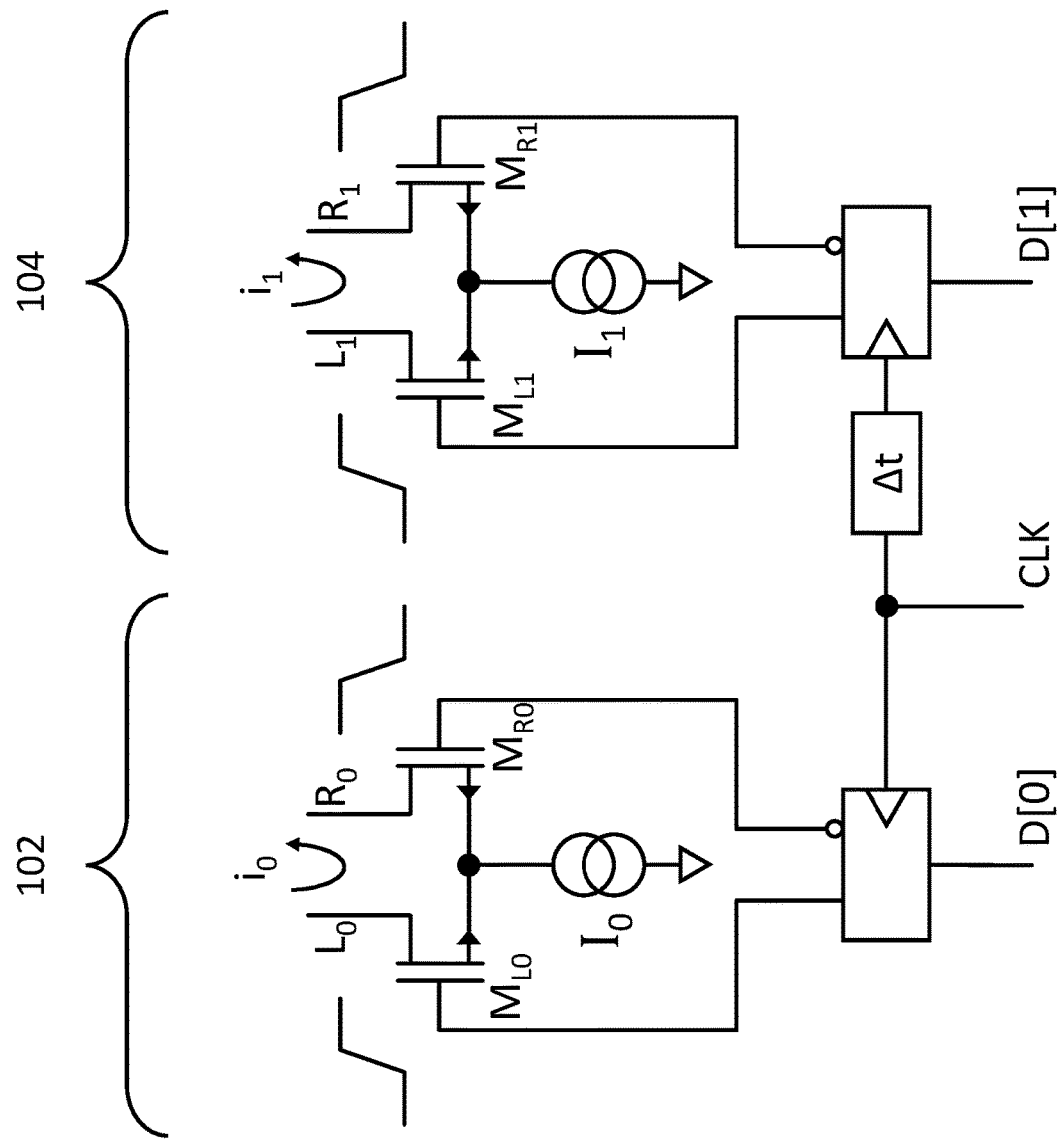
FIG. 1 shows two exemplary DAC cells, according to some embodiments of the disclosure.

Digital to analog converter generates an analog output corresponding to a digital input by controlling DAC cells using bits of the digital input. The DAC cells individually make a contribution to the analog output. Due to process, voltage, and temperature variations, the DAC cells may have duty cycle error or mismatches. To compensate for the duty cycle error of a DAC cell, a small amount of charge is injected into a low-impedance node of a DAC cell when the data signal driving the DAC cell transitions, or changes state. The small amount of charge is generated using a capacitive T-network, and the polarity of the charge injected is opposite of the error charge caused by duty cycle error. The opposite amount of charge thus compensates or cancels out the duty cycle error, and duty cycle error present at the output of the DAC cell is reduced.

DAC Architectures

DACs can be implemented in a variety of architectures. In some cases, a DAC can include a string of resistors and switches controllable by data bits of a digital input to configure the string of resistors and output different voltages at the analog output. In some cases, a DAC can include an R-2R resistor ladder and switches controllable by data bits of a digital input to configure the R-2R resistor ladder and output different voltages at the analog output. In some cases, a DAC can include current sources that are individually controllable by data bits of a digital input to steer current towards or away from the output of the DAC and output different amounts of current at the analog output In some cases, a DAC can include a bank of capacitors and switches controllable by data bits of a digital input to connect the plates of the capacitors to voltage references to implement charge redistribution and output different voltages at the analog output.

Regardless of the architecture, a DAC generally has individual elements, referred to as DAC cells herein, that are sized to make contributions of certain weights to an analog output of a DAC. DAC cells can be binary coded (e.g., where DAC cells are weighted according to $2^N$). DAC cells can be thermometer coded (e.g., where DAC cells have the same weight or unit weight).

A DAC can include a segmented design, where parts of a DAC is implemented using different architectures and/or weighing schemes. For instance, one part of the data bits of the digital input can control a DAC implemented in a first architecture and the DAC cells are binary coded, and another part of the data bits of the digital input can control a DAC implemented in a second, different architecture, and the DAC cells are thermometer coded. In one example, a DAC is segmented as a X-Y-Z segmented DAC. The X-Y-Z segmented DAC has a section for X most significant bits (MSBs), a section for Y intermediate significant bits (ISBs), and a section for Z least significant bits (LSBs). The MSB and ISB sections can be thermometer coded while the LSB section is binary coded. The sections can be implemented using different DAC architectures (e.g., resister string, R-2R, current-steering, and capacitive DAC architectures).

What are the Mismatches of DAC Cells, and Why Mismatches Matter

Due to process, temperature, and/or voltage variations, the weights of the DAC cells may not be exactly at their ideal weights. For instance, a group of DAC cells may not he exactly binary coded. For a group of DAC cells that are thermometer coded, the weights of the DAC cells may not be exactly the same as each other. Such mismatches in the weights of the DAC cells can cause DAC cells to have static errors. Also, due to process, temperature, and/or voltage variations, the switches of the DAC cells not all operate with the same timing. Such mismatches in the timing of switches can cause DAC cells to have timing skew errors and duty cycle errors.

FIG. 1 shows two exemplary DAC cells, according to some embodiments of the disclosure. For illustration, the DAC cells are current-steering DAC cells. One skilled in the art would appreciate that other types of DAC cells (e.g., comprising resistors, or capacitors) would also have the same and/or similar errors associated with mismatches. Mismatches can be associated with non-ideal weights, timing skew differences, and duty cycle differences. FIG. 1 shows two current-steering DAC cells, current-steering DAC cell 102 and current-steering DAC cell 104, having mismatches, according to some embodiments of the disclosure. Process, voltage, and/or temperature variations can cause mismatches.

A current-steering DAC cell has a current source (denoted as $i_0$ for DAC cell 102 and as $i_1$ for DAC cell 104) and may have two switches (shown as transistors $M_{L0}$ and $M_{R0}$ for DAC cell 102, and transistors $M_{L1}$ and $M_{R1}$ for DAC cell 104) coupled to the current source for steering the current. The two switches form a differential pair to generate differential current outputs. These switches are sometimes referred to as switching transistors or the switch core. The switches are controlled by a data bit D[k] of the digital input corresponding to the DAC cell to steer the current. Switches of the DAC cell 102 is controlled by, e.g., data signal or data bit D[0], and switches of the DAC cell 104 are controlled by, e.g., data signal or data bit D[1]. The data signal, i.e., the input data bit, for a given DAC cell can control whether the current is steered towards the one of the differential current outputs (denoted as $L_0$ for DAC cell 102, and $L_1$ for DAC cell 104) or the other one of the different current outputs (denoted as $R_0$ for DAC cell 102, and $R_1$ for DAC cell 104) of the given DAC cell. Current output of the current-steering DAC cell 102 is represented by $i_0$. Current output of the current-steering DAC cell 104 is represented by $i_1$. The circuit in the current-steering DAC cell ensures that exactly one of the two switches turns on to steer the current based on the input data bit (e.g., D[0] and D[1]). The turning on of the switches is clocked by clock signal CLK, which is provided to each DAC cell.

Static errors are caused by DAC cells having non-ideal weights. For current-steering DAC cells, the non-ideal weights can be caused by the current sources providing non-ideal amounts of current that do not match the ideal weights of the DAC cells. In some cases, static errors are called DC (direct current) errors. Static errors tend to show up and dominate at low frequencies.

Timing skew errors are caused by the timing skew difference among DAC cells. The timing skew Δt between two current-steering DAC cells, can be introduced by clock path mismatches and asymmetries, i.e., the CLK signal experiences different latencies as they arrive at the DAC cells. As a result, the charge or current being delivered to the respective outputs of the DAC cells, shown as $i_0$ and $1_1$ for DAC cells 102 and 104 respectively, are mismatched due to the timing skew of the clock signal CLK arriving at the DAC cells. As the speed of the DAC increases (e.g., for radio-frequency (RF) applications, the DAC operate at giga-samples per second), timing skew errors can be more present. In other words, timing skew errors can be significant at higher frequencies. Timing skew errors can be considered a type of dynamic error.

Duty cycle errors are caused by the mismatches in the switching transistors among the DAC cells. In some cases, this duty cycle error is also referred to as switching error. The mismatch in switching transistors would cause a difference in the timing of transitions in the DAC cell output. In other words, rising edges or falling edges that would otherwise occur at the same time instant between DAC cells would have an offset from each other. The offset or difference in timing of transitions between DAC cells can be caused by clock path mismatches and asymmetries, as well as the threshold voltage mismatches of the switching transistors between DAC cells.

Figure 2:
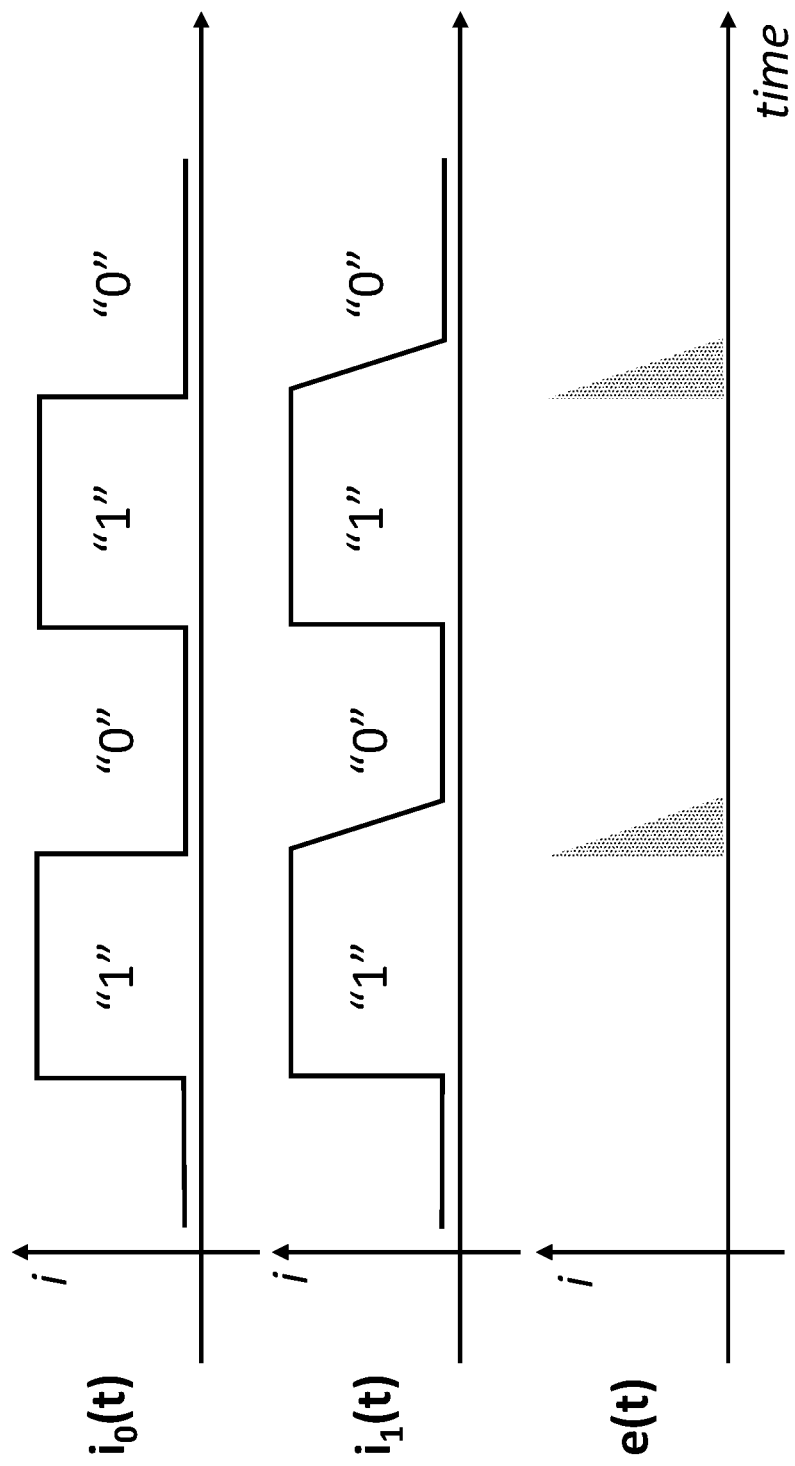
FIG. 2 shows current waveforms of the two exemplary DAC cells of FIG. 1 and error charge caused by duty cycle error, according to some embodiments of the disclosure.

As a result of the difference in timing of transitions, the charge or current being delivered to the respective outputs of the DAC cells at different switching instances, shown as $i_0(t)$ and $i_0(t)$ for DAC cells 102 and 104 respectively, are mismatched. FIG. 2 shows current waveforms, $i_0(t)$ and $i_1(t)$, of the two exemplary DAC cells of FIG. 1, and error charges caused by duty cycle error, according to some embodiments of the disclosure. The two DAC cells 102 and 104 are driven by the same data signal, e.g., the same input data bits of "1010". Ideally, the current waveforms, $i_0(t)$ and $i_1(t)$, should be exactly the same. However, mismatches in the switching transistors among DAC cells will cause the switching transistors to switch at different times. In other words, transitions of DAC cell outputs, e.g., rising edges and/or falling edges, may not occur at the same time. Even though the input data bits to the two DAC cells are the same, the mismatches of the switching transistors would cause the current waveforms, $i_0(t)$ and $i_1(t)$, to not be the same. The error waveform, e(t), represents the difference between the current waveforms, $i_0(t)$ and $i_1(t)$, for DAC cell 102 and DAC cell 104. When duty cycle mismatches between DAC cells cause different amount of charges to be delivered to the output of the DAC even though the input data bits are the same, the error waveform, e(t), is non-zero.

Figure 3:
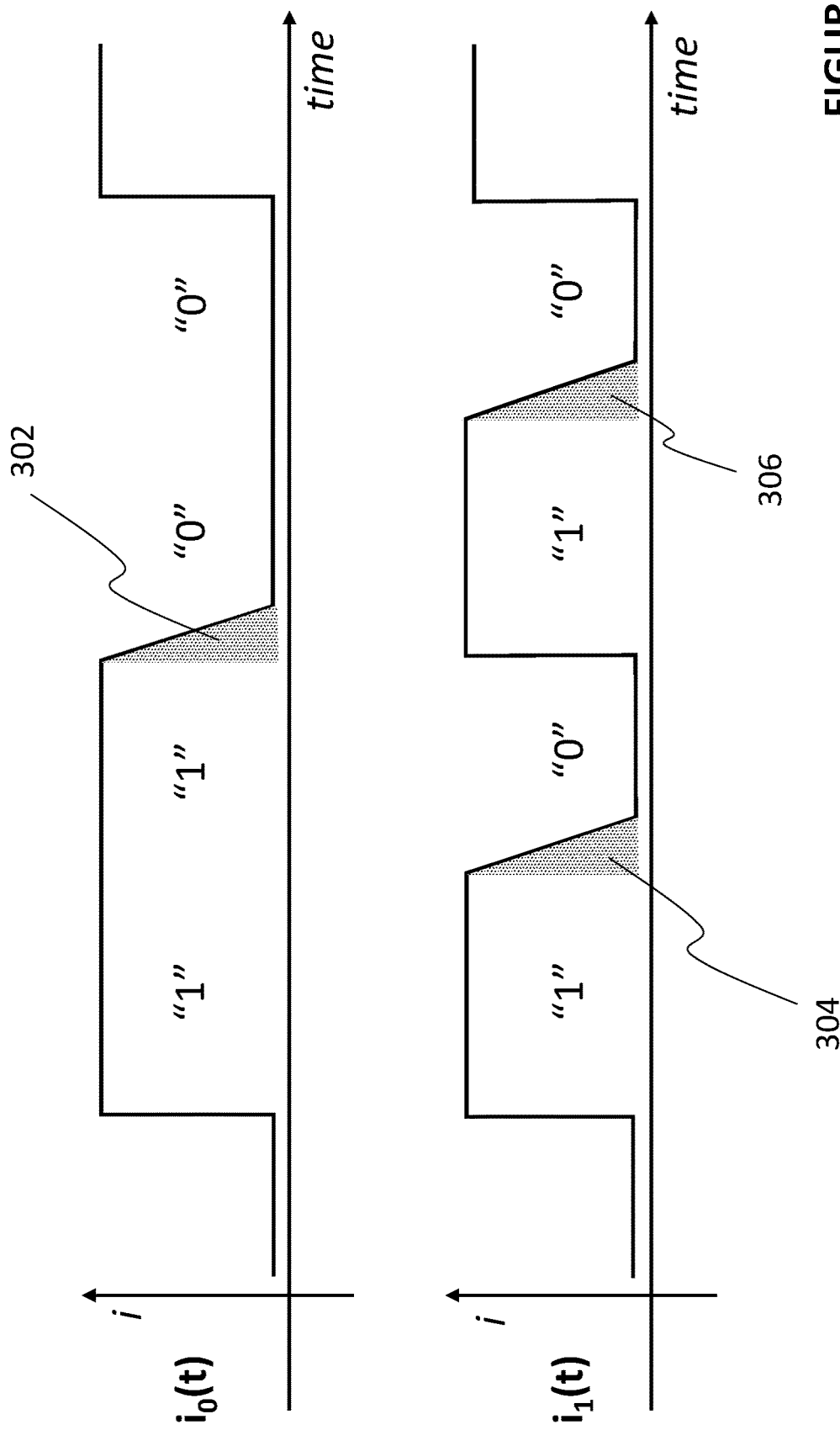
FIG. 3 shows current waveforms of the two exemplary DAC cells of FIG. 1 and error charges caused by duty cycle error at data signal transitions, according to some embodiments of the disclosure.

Error charges associated with duty cycle error appear when the DAC cells are not switching from one state to another state at the same time, or where the state transitions in the current waveforms are not aligned in time. As a result, over a period of time, one DAC cell can deliver more charge than another DAC cell. An error charge caused by duty cycle mismatch can be present at one or more of: the rising edge, and the falling edge, of the current waveform. FIG. 3 shows current waveforms, $i_0(t)$ and $i_1(t)$, of the two exemplary DAC cells of FIG. 1 and error charges caused by duty cycle error at data signal transitions, according to some embodiments of the disclosure. Input data bits of "1100" is driving DAC cell 102, resulting in a current waveform $i_0(t)$, and input data bits of "1010" is driving DAC cell 104, resulting in current waveform $i_1(t)$. For illustration, error charge 302 caused by duty cycle error is injected to the output of the DAC when the data signal driving DAC cell 102 transitions from "1" to "0". Error charge 304 and error charge 306 caused by duty cycle error are injected to the output of the DAC when the data signal driving DAC cell 104 transitions from "1" to "0". It can also be seen from the waveforms that input data bits "1100" and input data bits "1010" deliver different amounts of charge. Different data signals driving the DAC cells can mean that the number of transitions can differ, which causes in the amount of error charges injected to the output of the DAC to differ. Therefore, duty cycle error would be data or code dependent.

Duty cycle error will cause harmonic distortion. As the speed of the DAC increases (e.g., for RF applications, the DAC operate at giga-samples per second), duty cycle errors can be more present if the duty cycle mismatch dominates more of the (shorter) clock cycle or clock period. More switching activity will occur at higher speeds, which will accumulate as a higher amount of duty cycle error. In other words, duty cycle errors can be significant at higher frequencies for high bandwidth DACs. Duty cycle errors can be considered a type of dynamic error. Due to these errors, the Signal-to-Noise-and-Distortion Ratio (SNDR) and spurious free dynamic range (SFDR) performances of the DAC can be greatly deteriorated. Therefore, for high speed DACs, the correction of the various mismatches among the DAC cells can play a significant role in achieving high linearity.

Circuit to Correct DAC Duty Cycle Error

Techniques can be implemented, e.g., by providing a programmable load on the clock path or the data path to a DAC cell, in an attempt to address the duty cycle error of a DAC cell. However, adjusting the load on the clock path or data path to cause timing changes would not be able to decouple correction for timing skew error and correction of duty cycle error. Additionally, such techniques cannot directly address the core problem of switching transistor mismatch causing error charges to be delivered at data transitions.

Figure 4:
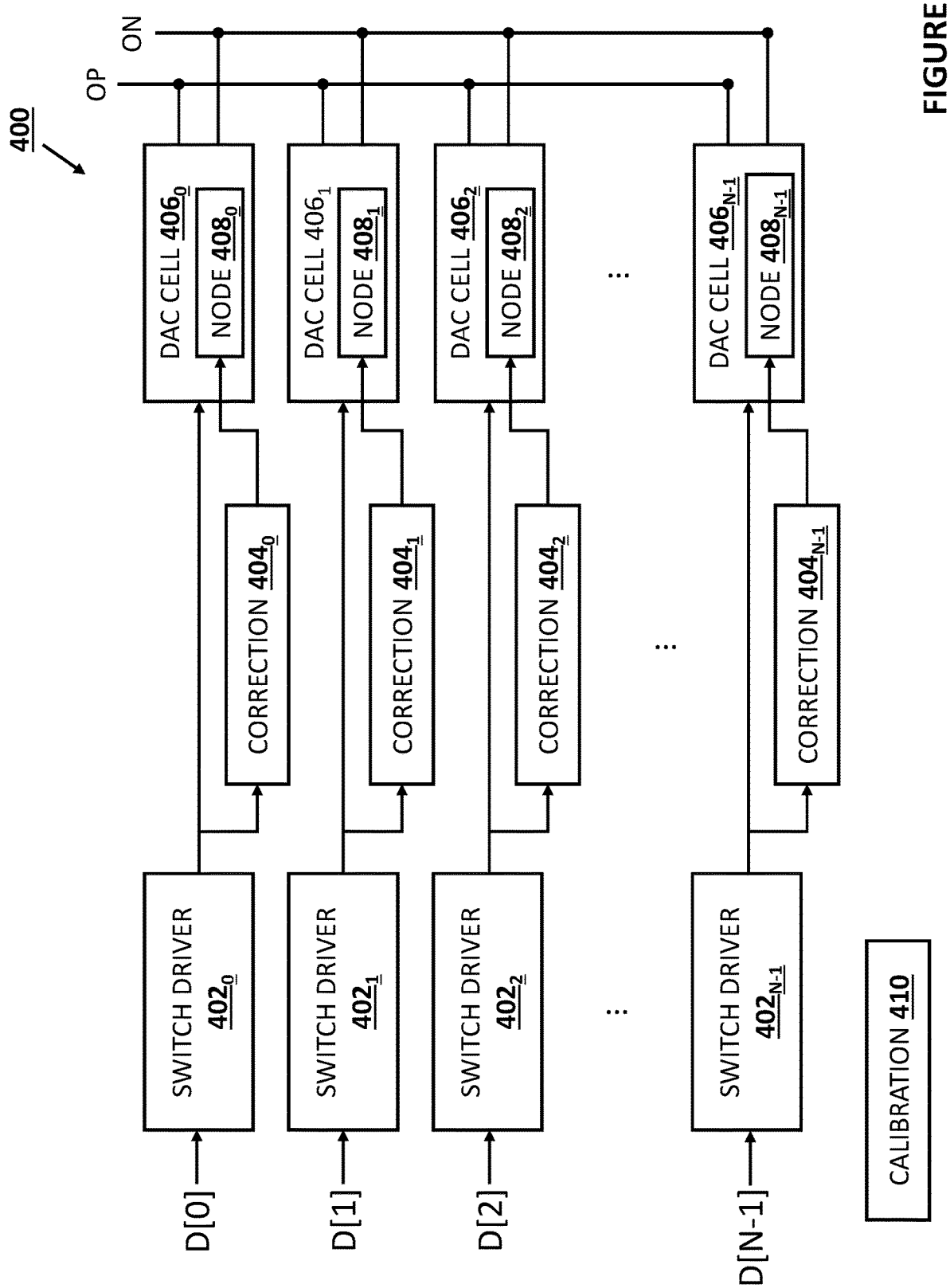
FIG. 4 shows a DAC having DAC cells with duty cycle error correction, according to some embodiments of the disclosure.

FIG. 4 shows a DAC having current-steering DAC cells with duty cycle error correction, according to some embodiments of the disclosure. DAC 400 includes N current-steering DAC cells $406_0$-$406_{N-1}$. Each current-steering DAC cell can be responsive to a respective data input, D[0], D[1], . . . D[N-1]. Optionally, DAC 400 includes N switch drivers $402_0$-$404_{N-1}$ to drive the N current-steering DAC cells $406_0$-$406_{N-1}$. A switch driver latches a corresponding data input from the data path, and output data signals to drive switches (or transistors) in a switch core of a corresponding DAC cell. The switch core of a DAC cell can, responsive to the data signals from the switch driver, steer an amount of current to either differential outputs, OP and ON, of the DAC 400.

To correct duty cycle error, a correction circuit is provided for a current-steering DAC cell, to inject an amount of charge in the DAC cell that can counteract the duty cycle error and its collateral effects, at or near a time the data signal transitions. As shown, the DAC 400 includes N correction circuits $404_0$-$404_{N-1}$. A correction circuit receives signals in the data path, such as data signals from a corresponding switch driver. The correction circuit is coupled to low-impedance node, e.g., one of nodes $408_0$-$408_{N-1}$, of a corresponding current-steering DAC cell. The correction circuit is responsive to the data signal from the corresponding switch driver, and injects a specific amount of charge at a low-impedance node of a corresponding current-steering DAC cell when the data signal transitions. The correction circuit can be controllable or programmable to inject a specified amount of charge at the low-impedance node. The specified amount of charge can be opposite of an error charge induced by duty cycle error.

Designing the correction circuit is not trivial. Considering a high speed, radio-frequency, DAC with an output frequency $f_{out}$ of GHz, the error charge induced by a duty cycle mismatch has to be less than 50 atto-Coulomb to achieve a SFDR of 75 decibels relative to the carrier (dBc). If the voltage step is 1 volt (V), a capacitor of 50 atto-farad may be needed to provide such small charge for correction. Fabricating such a capacitor on the order of $10^{-18}$ farad is very difficult if not impossible. Some techniques have considered using a capacitive DAC to adjust the loading on the switch driver's output, effectively adjusting the duty cycle of the data signal. However, using a capacitive DAC in this manner changes the timing skew mismatch among the DAC elements and can introduce additional distortion. To address some of these shortcomings and achieve charge injection on the order of atto-Coulombs, the correction circuit includes a capacitor T-network charge pump, or a capacitive T-network. Additionally, a buffer or inverter can be included to buffer the data signal from the switch driver. The capacitor T-network charge pump is coupled to and injects charge at a low-impedance node of the current-steering DAC cell. Capacitance of one of the capacitors in the capacitor T-network can be adjustable to change the effective capacitance of the capacitor T-network, thus, making the amount of charge to be injected adjustable.

In some embodiments, calibration circuitry 410 can be implemented (e.g., as a on-chip microprocessor and/or dedicated digital circuitry) to observe the outputs OP and ON of the DAC 400 and extract duty cycle error of the various DAC cells $406_0$-$406_{N-1}$. In some cases, the calibration circuitry 410 includes a dither generator to generate a dither, which can be used to drive a dummy DAC cell and/or any one of the DAC cells $406_0$-$406_{N-1}$ to expose the duty cycle error. The duty cycle errors can be measured based on the outputs of the DAC 400 and the switching activity of the dither, The measured duty cycle errors can be used to control the correction circuits $404_0$-$404_{N-1}$ accordingly, to correct or compensate for the measured duty cycle error. Other techniques for exposing and measuring the duty cycle error are envisioned by the disclosure.

Exemplary Circuit Implementations to Address Duty Cycle Error

Figure 5:
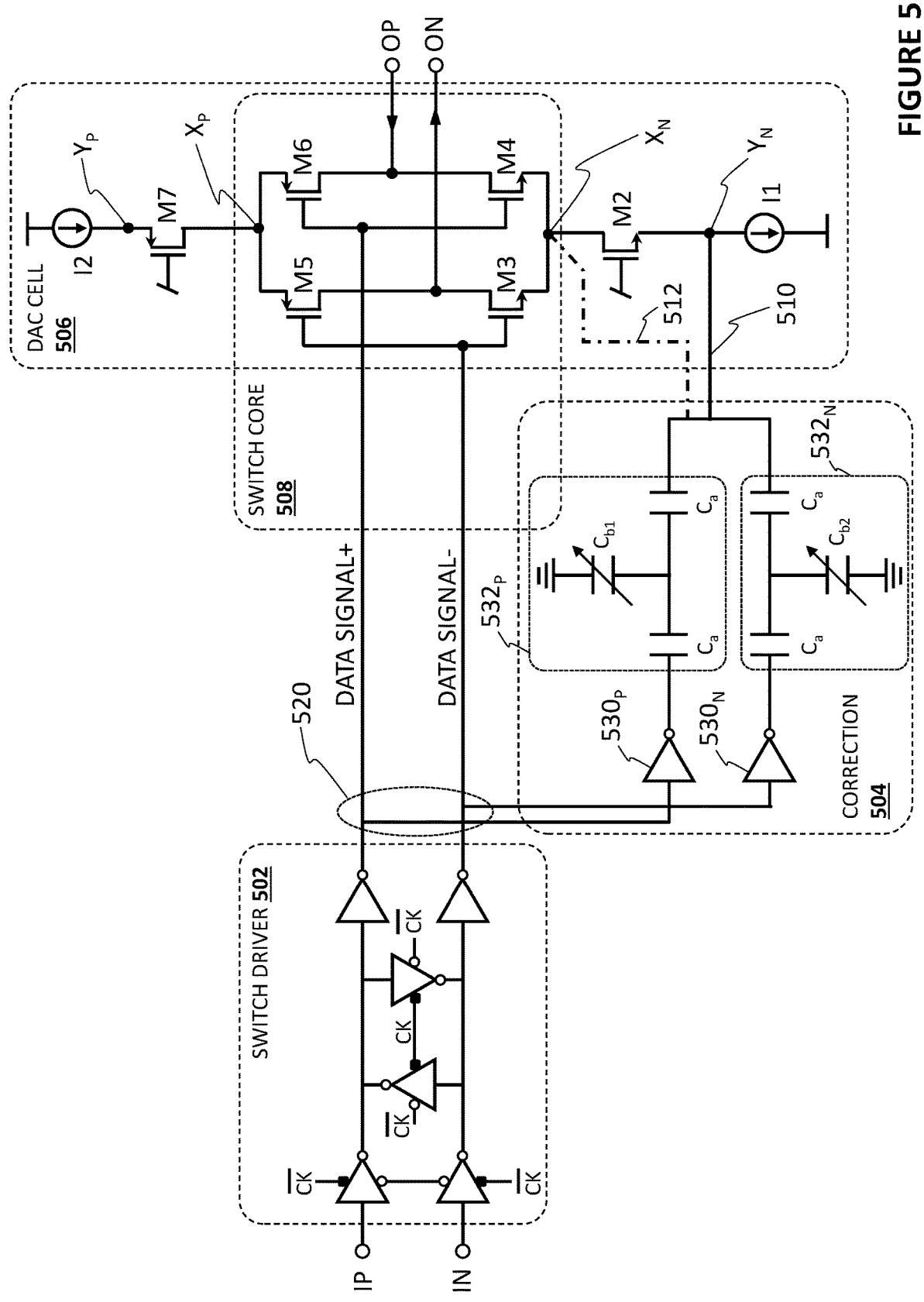
FIG. 5 shows a switch driver, a DAC cell with a switch core, and a correction circuit, according to some embodiments of the disclosure.

FIG. 5 shows a switch driver 502, a DAC cell 506 with a switch core 508, and a correction circuit 504, according to some embodiments of the disclosure. The circuit shown can be implemented for a DAC with duty cycle error correction. The embodiment shown illustrates the spirit of the invention, and is not meant to be limiting to the disclosure.

The switch driver 502 can include clocked buffers that latches the data inputs IP and IN. the implementation of the switch driver 502 may buffer, filter, and/or modify the data inputs IP and IN ensure that the data signals 520 (in some cases referred to as a data signal) are suitable and compatible to drive the devices in switch core 508. For instance, the switch driver 502 may provide isolation between the data inputs IP and IN and the switch core 508. The switch driver 502 may ensure the voltage levels and swing of the voltage levels of the data signals 520 driving the devices in switch core 508 are appropriate. The switch driver 502 may also ensure the timing and shape of transitions in the data signals 520 driving the devices in switch core 508 are appropriate and suitable for driving the devices in switch core 508. The implementation of the switch driver 502 as shown merely illustrates one possible implementation, and it is envisioned by the disclosure that other equivalent implementations can be used. The performance, in particular, speed, of the switch core, can depend on the performance of the switch driver 502. The embodiment shown receives a differential data input. The data signals 520 includes a positive differential data signal and a negative differential data signal.

The DAC cell 506 represents current-steering circuitry that are controllable by data signals 520 to generate outputs OP and ON. The outputs include a positive differential output ON, and a negative differential output ON. Various DAC cell architectures are envisioned by the disclosure, and for illustration, and complementary DAC cell using dual-switches are shown, Other current-steering DAC cell architectures having current-steering transistors as devices can benefit from the invention as well. For instance, DAC cell 506 can be implemented as a dual-switch DAC cell. In another instance, DAC cell 506 can be implemented as a quad-switch DAC cell.

For complementary DAC cell design, DAC cell 506 has complementary circuits, a first side with p-type transistor devices and a second side with p-type transistor devices. The transistor devices can be implemented as field-effect transistors (FETs). FETs generally have several terminals: drain, source, and gate. Transistors can be of one of two types: n-channel or n-type, and p-channel or p-type. The two types are complementary to each other. FETs can be fabricated in different types of semiconductor process technologies, such as complementary metal-oxide-semiconductor (CMOS) technology, Silicon On Insulator (SOI) technology, or fin field-effect transistors (FinFET) technology.

Broadly speaking, the DAC cell 506 has switching transistors, a tail current transistor, and a current source. For the complementary dual DAC design, DAC cell 506 includes four switching transistors (forming the switch core 508) which are responsive data signals 520. As shown, switch core 508 has p-type transistor devices M5 and M6, and n-type transistor devices M3 and M4. Gates of M5 and M3 receive the negative differential data signal. Gates of M6 and M4 receive the positive differential data signal. The drains of M5 and M3 are coupled together to form the negative differential output ON. The drains of M6 and M4 are coupled together to form the positive differential output ON. Sources of M5 and M6 are coupled together. Sources of M3 and M4 are coupled together.

Furthermore, DAC cell 506 has tail current transistors: p-type tail current transistor device M7 and n-type tail current transistor device M2. Drain of M7 is coupled to sources of M5 and M6 (the sources of MS and M6 are sometimes referred to as a tail node, or a common source node). Drain of M2 is coupled to sources of M3 and M4 (the sources of M3 and M4 are sometimes referred to as a tail node, or a common source node).

Additionally, DAC cell 506 has current sources I2 and I1. Current source I2 is coupled to source of MT Current source I1 is coupled to source of M2. Current sources I2 and I1 can be implemented using transistor devices biased to provide a specific amount of current for the switch core 508.

The correction circuit 504 receives data signals 520 and is coupled to a low-impedance node, e.g., a source node in the current-steering DAC cell 506. The correction circuit 504 includes a capacitance network responsive to transitions in the data signals 520. The capacitance network is coupled to one or more source nodes in the current-steering DAC cell 506. A capacitance network is provided for each differential data signal in a complementary design. For instance, a capacitance network $532_P$ is electrically coupled to the positive differential data signal, and a capacitance network $534_P$ is electrically coupled to the negative differential data signal. Capacitance network $532_P$ is responsive to transitions in the positive differential data signal, and is coupled to a source node in the DAC cell 506. Capacitance network $532_N$ is responsive to transitions in the negative differential data signal, and is coupled to a source node in the DAC cell 506. Capacitance network $532_P$ and capacitance network $532_N$ can inject and/or draw an amount of charge to correct or compensate for duty cycle error. The charge being injected or removed from the switch core 508 at the transitions thus can move the transitions in the differential output OP and ON in either direction in time. Accordingly, the charge being injected or drawn can change the duty cycle in either direction (to increase duty cycle or to decrease duty cycle).

For DAC cell 506, there are a plurality of low-impedance nodes, or source nodes: $Y_P$ at the source of M7, $X_P$ at the sources of M5 and M6, $X_N$ at the sources of M3 and M4, and $Y_N$, at the source of M2. Broadly speaking, the correction circuit 504 can be coupled to one source node, or a combination of source nodes. In some embodiments, capacitance network $532_P$ and capacitance network $532_N$ can be coupled to the same source node. In some other embodiments, capacitance network $532_P$ and capacitance network $532_N$ can be coupled to the different source nodes. Illustrated by connection 510, capacitance network $532_P$ and capacitance network $532_N$ can be coupled to node $Y_N$. Illustrated by connection 512, capacitance network $532_P$ and capacitance network $532_N$ can alternatively be coupled to node $X_N$. Varied embodiments are further illustrated in FIGS. 7-9.

In some embodiments, the source node to which the capacitance network is coupled can include a source terminal of a switching transistor (e.g., one of M5, M6, M3, and M4). In some embodiments, the source node is at a source terminal of a tail current transistor (e.g., one of M7 and M2). One aspect of the correction circuit 504 is to inject or draw a corresponding amount of charge from the differential outputs OP and ON such that the error charge caused by duty cycle error of the DAC cell 506 can be cancelled or compensated. Accordingly, the correction circuit 504 preferably is coupled to a low-impedance node (e.g., a source node) to which charge can be injected or drawn away efficiently and effectively. The source nodes $X_P$ and $X_N$ may settle faster, however, source nodes $X_P$ and $X_N$ can be critical for linearity performance of the DAC cell 506. Source nodes $Y_N$ and $Y_N$ may settle slower, but are less critical for linearity performance of the DAC cell 506 (since the nodes are farther away from the differential outputs OP and ON).

In some embodiments, the correction circuit 504 includes a buffer to buffer data signal, and the capacitance network receives a buffered signal from the buffer. For instance, the correction circuit 504 includes a buffer $530_P$ that is coupled to the positive differential data signal, and buffers the positive differential data signal. The correction circuit 504 can includes a buffer $530_N$ that is coupled to the negative differential data signal, and buffers the negative differential data signal. Buffer $530_P$ is in front of capacitance network $532_P$. Buffer $530_N$ is in front of capacitance network $532_N$. As illustrated, the buffer $530_P$ and $530_N$ are inverters. In other words, the correction circuit 504 can include an inverter to invert the data signal, and the capacitance network receives an inverted signal from the inverter. Inverter $530_P$ is coupled to the positive differential data signal and inverts the positive differential data signal. Inverter $530_N$ is coupled to the negative differential data signal and inverts the negative differential data signal. The buffer or inverter in front of the capacitance network can reduce any kickback from the charge pumps in the capacitance network and reduce the capacitance network's load to the data path.

Broadly speaking, the delay of the correction circuit 504, which includes delay of the buffer or inverter, the delay of the capacitance network, and settling time of the capacitance network at the output, preferably aligns with the delay of the data path, i.e., the amount of delay of the data signals 520 to cause the output of the DAC cell 506 to change. In some embodiments, correction circuit 504 has a delay that matches a delay of the current-steering DAC cell (i.e., how quickly the output changes in response to the data signals 520 changing). The alignment of the parallel paths ensures that charge can be injected or drawn from the output at the transition to adjust the duty cycle. If the injected charge is to settle fast (to be aligned with the data path), the (extra) delay from the buffer or inverter, which is part of the correction circuit 504, may be considered. The selection of the source node(s) to be used, which may have different settling times, may also be considered.

The correction circuit can be coupled to any suitable node of the data path driving the switch core of the DAC cell, as long as the correction circuit can respond to transitions in the signal on the data path and pump an appropriate amount of charge to a low-impedance node in the DAC cell to cause error charges at the transitions in the output of the DAC cell to be compensated.

Capacitive T-Network as the Capacitance Network

Implementation of the capacitance networks $532_P$ or $532_N$ in the correction circuit 504 is not trivial, because the amount of charge to be injected at the source node(s) responds on the data signals 520, and is preferably adjustable based on the amount of duty cycle error to be corrected or compensated. Additionally, as the speed or rate of the DAC gets higher, the amount of charge to be injected becomes very small. Implementing a variable, and small capacitance accurately in an integrated circuit can be difficult.

Figure 6:
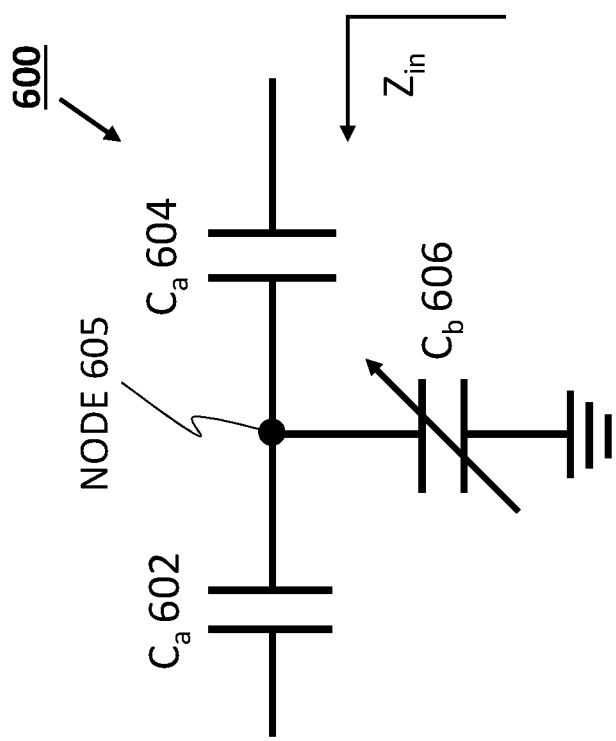
FIG. 6 shows a capacitive T-network, according to some embodiments of the disclosure.

FIG. 6 shows a capacitive T-network 600, according to some embodiments of the disclosure. Referring briefly to FIG. 5, capacitance networks $532_P$ or $532_N$ can be implemented using a capacitive T-network, or a T-network of capacitances. The overall capacitance of the capacitance network $532_P$ or $532_N$ is variable. The overall variable capacitance is responsive to a duty cycle error of the current-steering DAC cell. The overall capacitance is correlated to the amount of charge that can be injected or drawn from the outputs OP and ON, and thus is adjustable to correct or compensate for different amounts of duty cycle error. The variable capacitance of capacitance network $532_P$ may be different from the variable capacitance of capacitance network $532_N$.

Referring back to FIG. 6, the capacitive T-network 600 has a first capacitance $C_a$ 602, a second capacitance $C_a$ 604 in series with the first capacitance $C_a$ 602, a node 605 between the first capacitance $C_a$ 602 and the second capacitance $C_a$ 604, and a third capacitance $C_b$ 606 between the node 605 and ground. The third capacitance $C_b$ 606 is a variable capacitor, or has variable capacitance.

For the capacitive T-network 600, the effective capacitance is $$\frac{C_a^2}{C_b} \text{ if } C_b \gg C_a.$$

Referring back to FIG. 5, The differential equivalent capacitance of the correction circuit 504 having a capacitive T-network implemented on both the positive differential data signal and the negative differential data signal is $$\frac{(C_{b1} - C_{b2})C_a^2}{C_{b1}C_{b2}}.$$

For example, if $C_{b1}$=49 femtoFarads(fF), $C_{b2}$=51 fF and $C_a$=1 fF, the differential equivalent capacitance is approximately 1/1250 FemtoFarads=0.8 attoFarads. The variable capacitance $C_{b1}$ and $C_{b2}$ (of FIG. 5) can be implemented in an integrated circuit using a capacitor bank with tens of fF capacitors arranged in tunable capacitor array. The capacitor bank can have a tuning step of 1 fF. Accordingly, the capacitive T-network 600 provides an effective and accurate way to inject or draw charge on the order of attoCoulombs.

Other Exemplary Circuit Implementations to Address Duty Cycle Error

Figure 7:
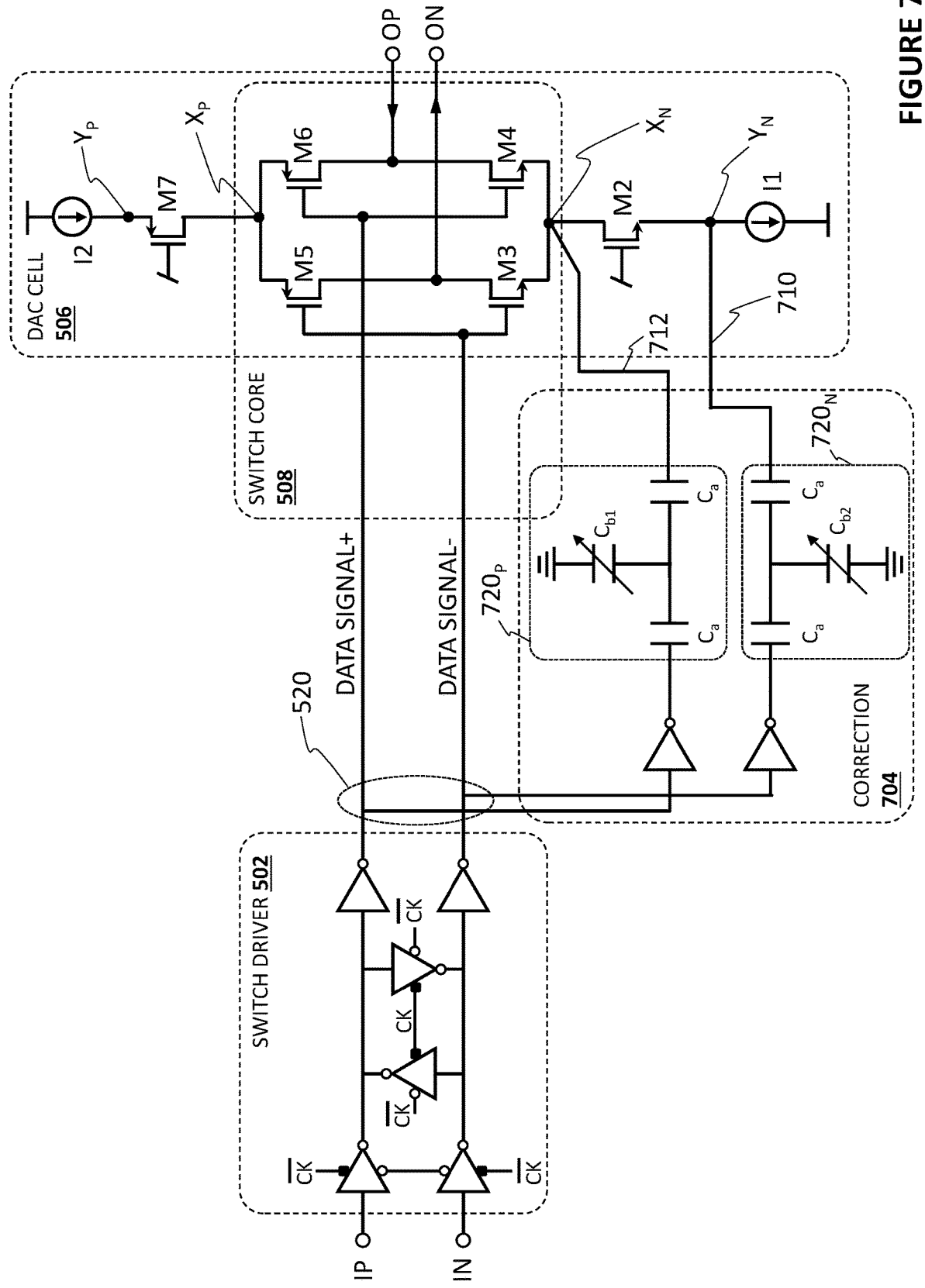
FIG. 7 shows a switch driver, a DAC cell with a switch core, and an alternative correction circuit, according to some embodiments of the disclosure.
Figure 8:
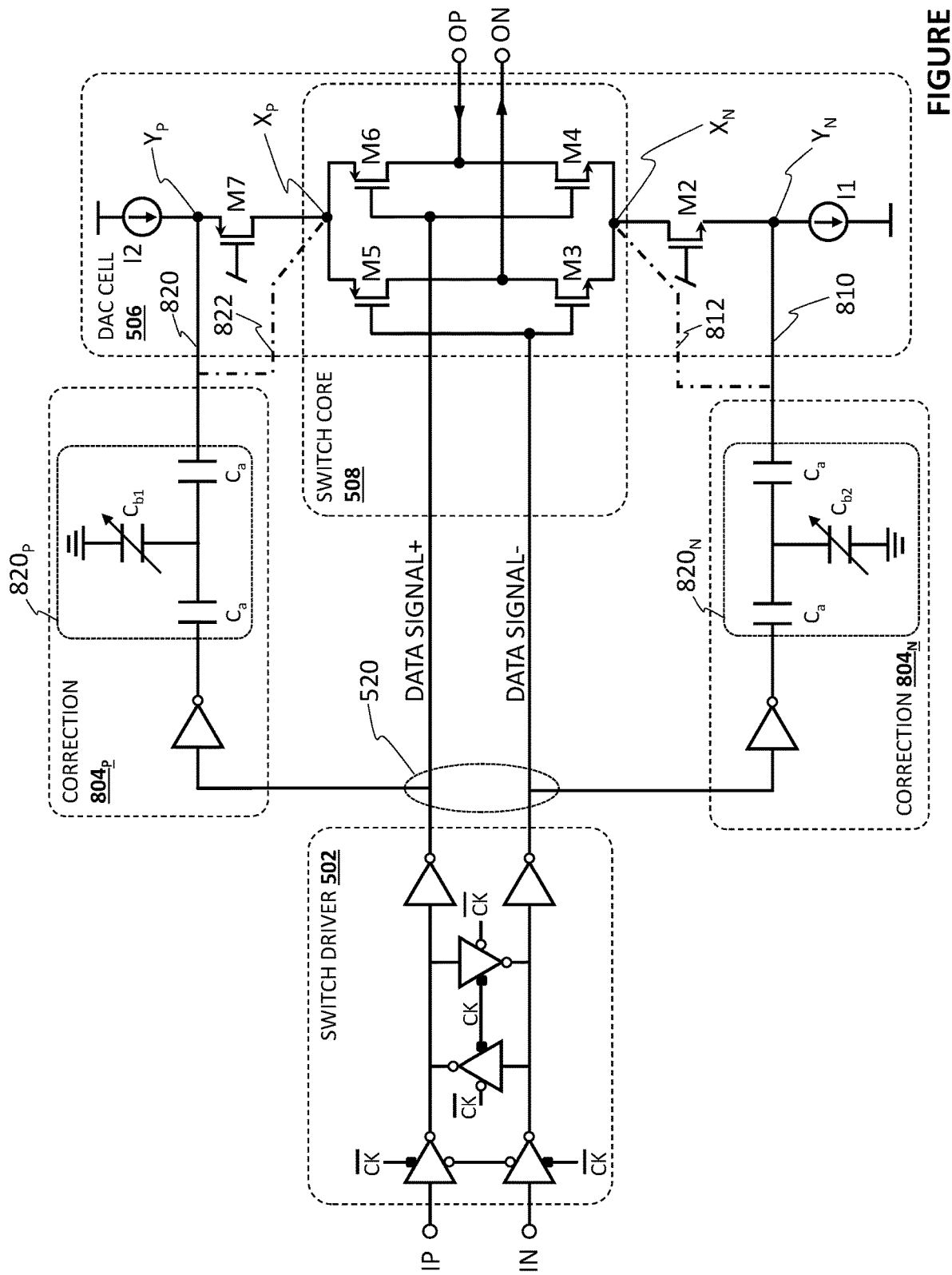
FIG. 8 shows a switch driver, a DAC cell with a switch core, and another alternative correction circuit, according to some embodiments of the disclosure.
Figure 9:
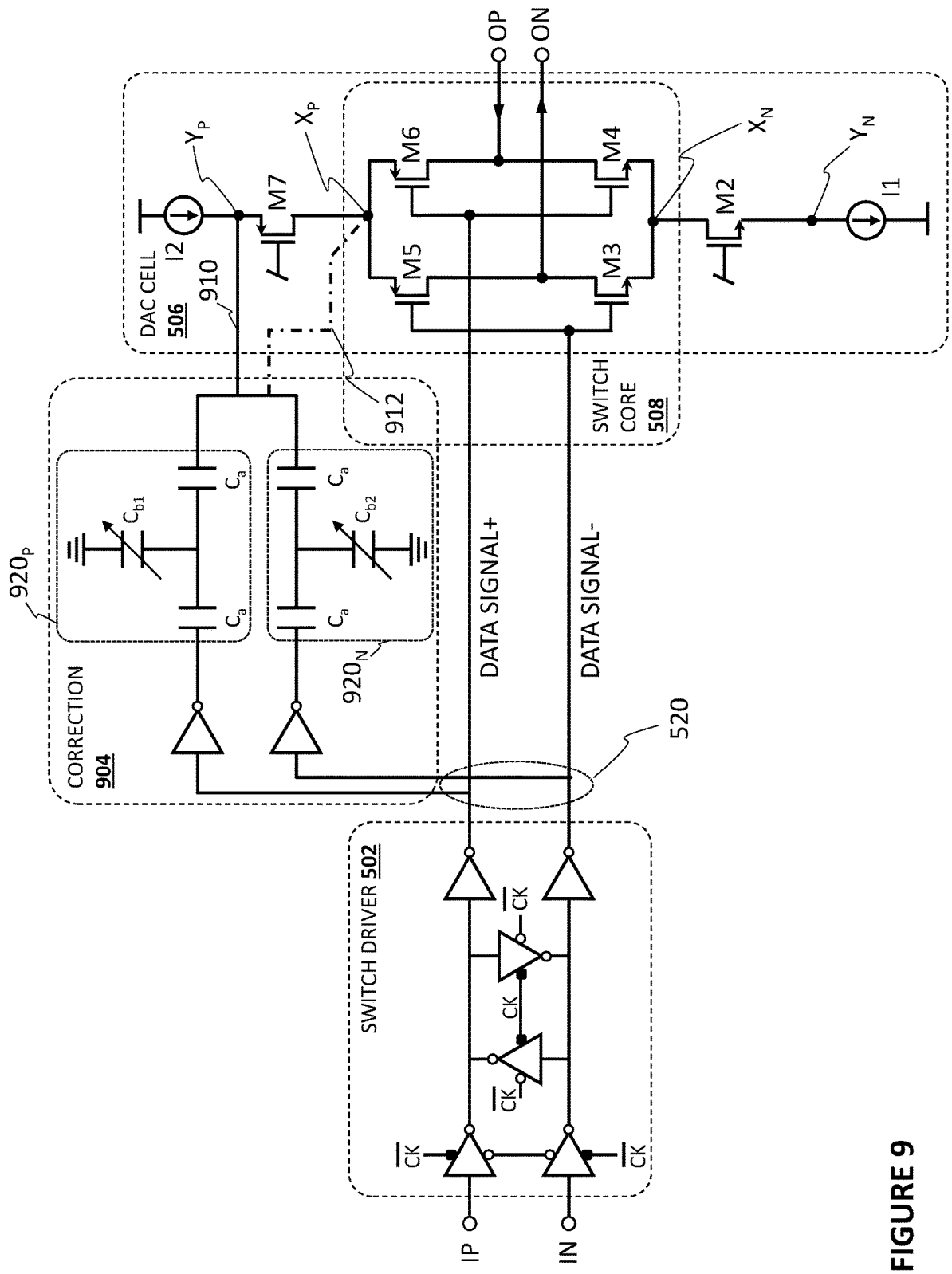
FIG. 9 shows a switch driver, a DAC cell with a switch core, and yet another alternative correction circuit, according to some embodiments of the disclosure.

As illustrated previously in FIG. 5, the correction circuit 504 includes capacitance network $532_P$ electrically coupled to the positive differential data signal and coupled to a source node $Y_N$, and capacitance network $532_P$ electrically coupled to the positive differential data signal and coupled to the source node $Y_N$. FIG. 5 also illustrates that the capacitance network $532_P$ and capacitance network $532_P$ can be coupled to source node $X_N$. FIGS. 7-9 illustrates other configurations where the capacitance networks are coupled to other source nodes or combination of source nodes in the DAC cell 506. The correction circuits in FIGS. 7-9 are otherwise implemented in a similar or same fashion as the ones illustrated in FIGS. 5 and 6.

FIG. 7 shows a switch driver 502, a DAC cell 506 with a switch core 508, and an alternative correction circuit 704, according to some embodiments of the disclosure. The correction circuit 704 includes capacitance network $720_P$ and capacitance network $720_N$. The complementary capacitance networks in the correction circuit are coupled to different source nodes. Capacitance network $720_P$ is electrically coupled to the positive differential data signal and coupled to a source node $X_N$ via connection 712. Capacitance network $720_N$ is electrically coupled to the negative differential data signal and coupled to a source node $Y_N$ via connection 712.

Though not shown, alternatively, capacitance network $720_P$ can be coupled to source node $Y_N$, and capacitance network $720_N$ can be coupled to source node $X_N$.

FIG. 8 shows a switch driver 502, a DAC cell 506 with a switch core 508, and another alternative correction circuit $804_P$ and $804_N$, according to some embodiments of the disclosure. The correction circuit $804_P$ includes capacitance network $820_P$. The correction circuit $804_N$ includes capacitance network $820_N$. The complementary capacitance networks in the correction circuit are coupled to different source nodes and different complementary sides of the DAC cell 506.

Capacitance network $820_P$ is electrically coupled to the positive differential data signal and coupled to a source node $Y_P$ via connection 820. Alternatively, capacitance network $820_P$ is coupled to a source node $X_P$ via connection 822. Alternatively, though not shown, capacitance network $820_P$ is coupled to a source node $X_N$ or a source node $Y_N$.

Capacitance network $820_N$ is electrically coupled to the negative differential data signal and coupled to a source node $Y_N$ via connection 810. Alternatively, capacitance network $820_N$ is coupled to a source node $X_N$ via connection 812. Alternatively, though not shown, capacitance network $820_N$ is coupled to a source node $X_P$ or a source node YP.

FIG. 9 shows a switch driver 502, a DAC cell 506 with a switch core 508, and yet another alternative correction circuit 904, according to some embodiments of the disclosure. The correction circuit 904 includes capacitance network $920_P$ and capacitance network $920_N$. The complementary capacitance networks in the correction circuit are coupled to the same source node. Capacitance network $920_P$ is electrically coupled to the positive differential data signal and coupled to a source node $Y_P$ via connection 910. Capacitance network $920_N$ is electrically coupled to the negative differential data signal and coupled to a source node $Y_P$ via connection 910.

Alternatively, capacitance network $920_P$ is coupled to a source node $X_P$ via connection 912. Capacitance network $920_N$ is coupled to a source node $X_P$ via connection 912.

Method for Correcting Duty Cycle Error

Figure 10:
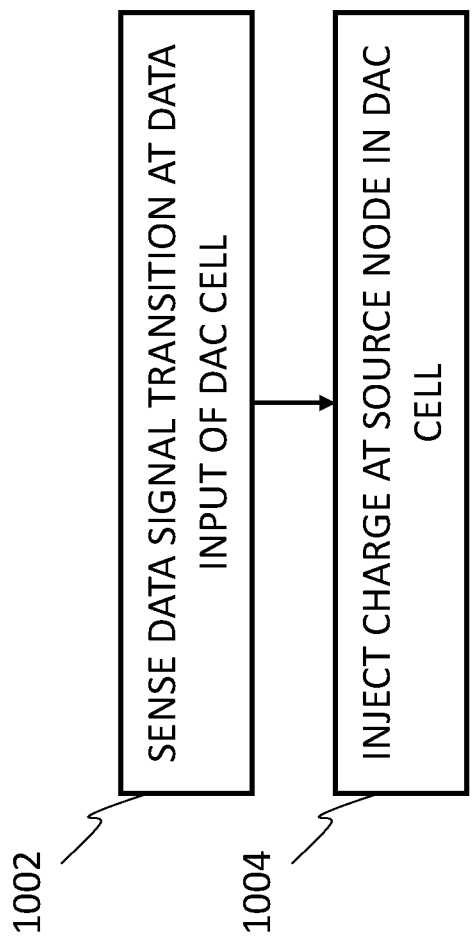
FIG. 10 is a flow diagram illustrating a method for correcting duty cycle error of a DAC, according to some embodiments of the disclosure.

FIG. 10 is a flow diagram illustrating a method for correcting duty cycle error of a DAC, according to some embodiments of the disclosure. In 1002, a correction circuit (e.g., correction circuits illustrated by FIGS. 509) senses a data signal transition at a data input of the current-steering DAC cell. The correction circuit is electrically coupled to the data path carrying the data signal that drives the DAC cell. In 1006, responsive to the data signal transition, the correction circuit injects (or draws) an amount of charge at a source node in the current-steering DAC cell. Accordingly, the timing of an output transition of the current-steering DAC cell can move in time, by means of injecting an amount of charge at a time instant that is aligned with the output transition of the current-steering DAC cell. The charge injected thus can adjust a duty cycle of the current-steering DAC cell, and correct or compensate for duty cycle error.

In some embodiments, injecting the amount of charge includes cancelling out at least a portion of a measured amount of error charge associated with the duty cycle error of the current-steering DAC cell.

In some embodiments, injecting the amount of charge includes causing an adjustment in a duty cycle of the output of the current-steering DAC cell.

In some embodiments, a calibration circuit (e.g., calibration circuitry 410 of FIG. 4) can observe an output of the current-steering DAC cell, and measuring an amount of error charge associated with the duty cycle error of the current-steering DAC cell based on the observing.

In some embodiments, the correction circuit senses the data signal transition by inverting the data input of the current-steering DAC cell. The inversion can be provided by an inverter, which then provides the inverted data signal to a capacitive network. The inverted data signal can actuate the capacitive network to pump charge to the source node, responsive to the data signal transition at the data input of the current-steering DAC cell. In some embodiments, the correction circuit senses the data signal transition by buffering the data input of the current-steering DAC cell.

In some embodiments, the source node is at a source terminal of a transistor in the current-steering DAC cell. FIGS. 5, and 7-9 illustrates examples of suitable source nodes.

In some embodiments, the current-steering DAC cell steers an amount of current to an output of the current-steering DAC cell responsive to the data input. Furthermore, the current-steering DAC can pass the amount of charge injected to the source node by the correction circuit through one or more transistors in the current-steering DAC cell to an output of the current-steering DAC cell.

EXAMPLES

Example 1 is a digital to analog converter (DAC) with duty cycle error correction, comprising: (1) a current-steering DAC cell comprising: switching transistors responsive to a data signal; a tail current transistor; and a current source; and (2) a correction circuit comprising: a capacitance network responsive to transitions in the data signal and coupled to a source node in the current-steering DAC cell.

In Example 2, the DAC of Example 1 can optionally include the source node in the DAC cell being at a source terminal of a switching transistor.

In Example 3, the DAC of Example 1 can optionally include the source node in the DAC cell being at a source of the tail current transistor.

In Example 4, the DAC of any one of Examples 1-3 can optionally include the correction circuit further comprising: a buffer to buffer the data signal; and the capacitance network receiving a buffered signal from the buffer.

In Example 5, the DAC of any one of Examples 1-4 can optionally include: the correction circuit further comprises an inverter to invert the data signal; and the capacitance network receives an inverted signal from the inverter.

In Example 6, the DAC of any one of Examples 1-5 can optionally include: the capacitance network comprising a T-network of capacitances.

In Example 7, the DAC of any one of Examples 1-6 can optionally include the capacitance network having variable capacitance.

In Example 8, the DAC of any one of Examples 1-7 can optionally include the capacitance network comprises: a first capacitance; a second capacitance in series with the first capacitance; a node between the first capacitance and the second capacitance; and a third capacitance between the node and ground.

In Example 9, the DAC of Example 8 can optionally include the third capacitance having variable capacitance.

In Example 10, the DAC of any one of Examples 1-9 can optionally include the capacitance network having a variable capacitance that is responsive to a duty cycle error of the current-steering DAC cell.

In Example 11, the DAC of any one of Examples 1-10 can optionally include the correction circuit having a delay that matches a delay of the current-steering DAC cell.

Example 12 is a digital to analog converter (DAC) with duty cycle error correction, comprising: (1) a current-steering DAC cell comprising: a first switching transistor to receive a positive differential data signal and to generate a positive differential output; a second switching transistor to receive a negative differential data signal and to generate a negative differential output; a first tail current transistor coupled to the first switching transistor; and a first current source coupled to the first tail current transistor; and (2) a correction circuit comprising: a first capacitance network responsive to transitions in the positive differential data signal and coupled to a first source node in the current-steering DAC cell; and a second capacitance network responsive to transitions in the negative differential data signal and coupled to a second source node in the current-steering DAC cell.

In Example 13, the DAC of Example 12 can optionally include the current-steering DAC cell further comprising: a third switching transistor to receive the positive differential data signal and to generate the positive differential output; a fourth switching transistor to receive the negative differential data signal and to generate the negative differential output; a second tail current transistor coupled to the third switching transistor; and a second current source coupled to the second tail current transistor.

In Example 14, the DAC of Example 12 or 13 can optionally include the first source node and the second source node being at a same node in the current--steering DAC cell.

In Example 15, the DAC of Example 12 or 13 can optionally include the first source node and the second source node being at different nodes in the current-steering DAC cell.

In Example 16, the DAC of any one of Examples 12-15 can optionally include the first source node being at a source terminal of the first switching transistor.

In Example 17, the DAC of any one of Examples 12-15 can optionally include the second source node being at a source terminal of the first switching transistor.

In Example 18, the DAC any one of Examples 12-15 can optionally include the first source node being at a source terminal of the first tail current transistor.

In Example 19, the DAC of any one of Examples 12-15 can optionally include the second source node being at a source terminal of the first tail current transistor.

In Example 20, the DAC of any one of Examples 12-15 can optionally include the first source node being at a source terminal of the third switching transistor.

In Example 21, the DAC of any one of Examples 12-15 can optionally include the second source node being at a source terminal of the third switching transistor.

In Example 22, the DAC of any one of Examples 12-15 can optionally include the first source node being at a source terminal of the second tail current transistor.

In Example 23, the DAC of any one of Examples 12-15 can optionally include the second source node being at a source terminal of the second tail current transistor.

Any two or more of Examples 16-23 can be combined in a suitable manner.

In Example 24, the DAC of any one of Examples 12-23 can optionally include the correction circuit further comprising: a first buffer to buffer the positive differential data signal.

In Example 25, the DAC of any one of Examples 12-24 can optionally include the correction circuit further comprising: a second buffer to buffer the negative differential data signal.

In Example 26, the DAC of any one of Examples 12-25 can optionally include the correction circuit the correction circuit further comprising: a first inverter to invert the positive differential data signal.

In Example 27, the DAC of any one of Examples 12-26 can optionally include the correction circuit further comprising: a second inverter to invert the negative differential data signal.

Example 28 is a method to correct a duty cycle error of a current-steering digital to analog converter (DAC) cell, comprising: sensing a data signal transition at a data input of the current-steering DAC cell; and responsive to the data signal transition, injecting an amount of charge at a source node in the current-steering DAC cell.

In Example 29, the method of Example 28 can optionally include injecting the amount of charge comprising: cancelling out at least a portion of a measured amount of error charge associated with the duty cycle error of the current-steering DAC cell.

In Example 30, the method of Example 28 or 29 can optionally include injecting the amount of charge comprising: causing an adjustment in a duty cycle of the output of the current-steering DAC cell.

In Example 31, the method of any one of Examples 28-30 can optionally include: observing an output of the current-steering DAC cell; and measuring an amount of error charge associated with the duty cycle error of the current-steering DAC cell based on the observing.

In Example 32, the method of any one of Examples 28-31 can optionally include: sensing the data signal transition comprising: inverting the data input of the current-steering DAC cell.

In Example 33, the method of any one of Examples 28-32 can optionally include the source node being at a source terminal of a transistor in the current-steering DAC cell.

In Example 34, the method of any one of Examples 28-33 can optionally include: steering an amount of current to an output of the current-steering DAC cell responsive to the data input; and passing the amount of charge injected to the source node through one or more transistors in the current-steering DAC cell to an output of the current-steering DAC cell.

Example 35 is an apparatus comprising means for performing/implementing any one of the methods described herein, such as Examples 28-34 and methods illustrated by FIG. 10.

Other Implementation Notes, Variations, and Applications

It is also imperative to note that all of the specifications, dimensions, and relationships outlined herein (e.g., the number of processors, logic operations, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than in a restrictive sense.

The analog technique for DAC duty cycle error correction are particularly suitable for high speed, wide bandwidth, high precision applications where the performance of the DAC is critical. Applications which can greatly benefit from the architecture include: instrumentation, testing, spectral analyzers, military purposes, radar, wired or wireless communications, mobile telephones (especially because standards continue to push for higher speed communications), and base stations. These products are employed in wired and wireless communications, instrumentation, radar, electronic warfare, and other applications. DACs that can benefit from duty cycle error correction includes: stand-alone DACs, DACs implemented in delta-sigma modulators, DACs implemented in multi-stage noise-shaping analog-to-digital converters, DACs implemented in pipelined analog-to-digital converters, and DACs implemented in algorithmic analog-to-digital converters.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

It is also important to note that the functions related to the DAC duty cycle error correction technique, such as the processes shown in FIG. 10, illustrate only some of the possible functions that may be executed by, or within, the systems illustrated in FIGS. 3-6. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. Note that all optional features of the apparatus described above may also be implemented with respect to the method or process described herein and specifics in the examples may be used anywhere in one or more embodiments.

What is claimed is:

1. A digital to analog converter (DAC) with duty cycle error correction, comprising:
    a current-steering DAC cell comprising:
        switching transistors responsive to a data signal;
        a tail current transistor; and
        a current source; and
    a correction circuit comprising:
        a capacitance network responsive to transitions in the data signal and coupled to a source node in the current-steering DAC cell.

2. The DAC of claim 1, wherein the source node in the DAC cell is at a source terminal of a switching transistor.

3. The DAC of claim 1, wherein the source node in the DAC cell is at a source of the tail current transistor.

4. The DAC of claim 1, wherein:
    the correction circuit further comprises a buffer to buffer the data signal; and
    the capacitance network receives a buffered signal from the buffer.

5. The DAC of claim 1, wherein:
    the correction circuit further comprises an inverter to invert the data signal; and
    the capacitance network receives an inverted signal from the inverter.

6. The DAC of claim 1, wherein the capacitance network comprises a T-network of capacitances.

7. The DAC of claim 1, wherein the capacitance network has variable capacitance.

8. The DAC of claim 1, wherein the capacitance network comprises:
    a first capacitance;
    a second capacitance in series with the first capacitance;
    a node between the first capacitance and the second capacitance; and
    a third capacitance between the node and ground.

9. The DAC of claim 8, wherein the third capacitance has variable capacitance.

10. The DAC of claim 1, wherein the capacitance network has a variable capacitance that is responsive to a duty cycle error of the current-steering DAC cell.

11. The DAC of claim 1, wherein the correction circuit has a delay that matches a delay of the current-steering DAC cell.

12. A digital to analog converter (DAC) with duty cycle error correction, comprising:
    a current-steering DAC cell comprising:
        a first switching transistor to receive a positive differential data signal and to generate a positive differential output;
        a second switching transistor to receive a negative differential data signal and to generate a negative differential output;
        a first tail current transistor coupled to the first switching transistor; and
        a first current source coupled to the first tail current transistor; and
    a correction circuit comprising:
        a first capacitance network responsive to transitions in the positive differential data signal and coupled to a first source node in the current-steering DAC cell; and
        a second capacitance network responsive to transitions in the negative differential data signal and coupled to a second source node in the current-steering DAC cell.

13. The DAC of claim 12, wherein the current-steering DAC cell further comprises:
    a third switching transistor to receive the positive differential data signal and to generate the positive differential output;
    a fourth switching transistor to receive the negative differential data signal and to generate the negative differential output;
    a second tail current transistor coupled to the third switching transistor; and
    a second current source coupled to the second tail current transistor.

14. The DAC of claim 12, wherein the first source node and the second source node are at a same node in the current-steering DAC cell.

15. The DAC of claim 12, wherein the first source node and the second source node are at different nodes in the current-steering DAC cell.

16. The DAC of claim 12, wherein the correction circuit further comprises:
   a first inverter to invert the positive differential data signal.

17. The DAC of claim 12, wherein the correction circuit further comprises:
   a second inverter to invert the negative differential data signal.

18. A method to correct a duty cycle error of a current-steering digital to analog converter (DAC) cell, comprising:
   sensing a data signal transition at a data input of the current-steering DAC cell; and
   responsive to the data signal transition, injecting an amount of charge at a source node in the current-steering DAC cell.

19. The method of claim 18, wherein injecting the amount of charge comprises:
   cancelling out at least a portion of a measured amount of error charge associated with the duty cycle error of the current-steering DAC cell.

20. The method of claim 18, wherein injecting the amount of charge comprises:
   causing an adjustment in a duty cycle of an output of the current-steering DAC cell.

* * * * *